United States Patent
Muraoka

(10) Patent No.: US 9,585,251 B2
(45) Date of Patent: Feb. 28, 2017

(54) METHOD OF MANUFACTURING CONDUCTIVE WIRING AND CONDUCTIVE WIRING

(71) Applicant: SHUHOU CO., LTD., Fukui (JP)

(72) Inventor: Kouji Muraoka, Fukui (JP)

(73) Assignee: SHUHOU CO., LTD., Fukui (JP)

( * ) Notice: Subject to any disclaimer, the term of this patent is extended or adjusted under 35 U.S.C. 154(b) by 0 days.

(21) Appl. No.: 14/897,862

(22) PCT Filed: Oct. 24, 2014

(86) PCT No.: PCT/JP2014/078381
§ 371 (c)(1),
(2) Date: Dec. 11, 2015

(87) PCT Pub. No.: WO2015/145848
PCT Pub. Date: Oct. 1, 2015

(65) Prior Publication Data
US 2016/0128189 A1    May 5, 2016

(30) Foreign Application Priority Data

Mar. 28, 2014  (JP) ................ 2014-068487
Aug. 5, 2014  (JP) ................ 2014-159588
Aug. 5, 2014  (JP) ................ 2014-159602

(51) Int. Cl.
*H05K 1/09*  (2006.01)
*H05K 3/14*  (2006.01)
*H05K 3/10*  (2006.01)

(52) U.S. Cl.
CPC ............ *H05K 1/092* (2013.01); *H05K 3/102* (2013.01); *H05K 3/14* (2013.01);
(Continued)

(58) Field of Classification Search
CPC ........... H05K 1/092; H05K 3/14; H05K 3/102
(Continued)

(56) References Cited

U.S. PATENT DOCUMENTS 3,506,482 A * 4/1970 Nakamura ............ H05K 3/102
174/259
4,255,475 A * 3/1981 DelGrande ............ B23K 1/20
156/276
(Continued)

FOREIGN PATENT DOCUMENTS

EP     1 887 583 A1    2/2008
JP     11-307910 A    11/1999
(Continued)

OTHER PUBLICATIONS

International Search Report (ISR) dated Jan. 14, 2015 for International Application No. PCT/JP2014/078381.
(Continued)

*Primary Examiner* — Timothy Thompson
*Assistant Examiner* — Charles Pizzuto
(74) *Attorney, Agent, or Firm* — Ladas & Parry LLP

(57) ABSTRACT

A method of manufacturing conductive wiring includes: printing on an insulated substrate 1 with ink 2 to form a predetermined pattern (S1); placing (spraying) conductive powder 3 on the ink 2 (in the predetermined pattern) before the printed ink 2 dries (S2); pressing the placed conductive powder 3 against the insulated substrate 1 to compress the conductive powder 3 (S3); and heating the compressed conductive powder 3 to sinter the conductive powder 3 (S4), and by such a series of processes (S1 to S4), conductive wiring 20 is manufactured.

3 Claims, 3 Drawing Sheets

(52) U.S. Cl.
CPC ............ *H05K 2203/013* (2013.01); *H05K 2203/0522* (2013.01); *H05K 2203/107* (2013.01); *H05K 2203/1131* (2013.01)

(58) Field of Classification Search
USPC ........................................ 174/268; 29/846
See application file for complete search history.

(56) References Cited

U.S. PATENT DOCUMENTS

| | | | | |
|---|---|---|---|---|
| 7,859,481 | B2* | 12/2010 | Muraoka | H01Q 1/38 343/897 |
| 2002/0094382 | A1 | 7/2002 | Imai et al. | |
| 2004/0135498 | A1* | 7/2004 | Takanosu | H01L 51/0011 313/504 |
| 2010/0143601 | A1* | 6/2010 | Hawtof | F23D 14/08 427/446 |
| 2010/0233012 | A1* | 9/2010 | Higashi | B22F 3/1055 419/9 |
| 2014/0106068 | A1* | 4/2014 | Krause | B22F 3/1055 427/197 |

FOREIGN PATENT DOCUMENTS

| | | | |
|---|---|---|---|
| JP | 11307910 | A * | 11/1999 |
| JP | 2002-33566 | A | 1/2002 |
| JP | 2007-53212 | A | 3/2007 |
| JP | 2010 529667 | A | 8/2010 |
| JP | 2010529667 | A * | 8/2010 |
| TW | 583503 | B | 4/2004 |
| TW | 1413474 | B | 10/2013 |
| WO | 2008/152193 | A1 | 6/2010 |

OTHER PUBLICATIONS

J-PlatPat English abstract of JP 2007-53212 A.
J-PlatPat English abstract of JP 11-307910 A.
J-PlatPat English abstract of JP 2002-33566 A.
Office Action dated May 18, 2016 for Taiwan Patent Application No. 103137773 with English translation.
espacenet English abstract of TW 1413474 B.
espacenet English abstract of TW 583503 B.
Korean Office Action dated Nov. 28, 2016 for Korean Patent Application No. 10-2015-7032601 with English translation.

* cited by examiner

METHOD OF MANUFACTURING CONDUCTIVE WIRING AND CONDUCTIVE WIRING

RELATED APPLICATION

This application is an application under 35 U.S.C. 371 of International Application No. PCT/JP2014/078381 filed on Oct. 24, 2014, the entire contents of which are incorporated herein by reference.

TECHNICAL FIELD

The present invention relates to a method of manufacturing conductive wiring and conductive wiring, and in particular, relates to a method of manufacturing conductive wiring formed of conductive powder and the conductive wiring.

BACKGROUND ART

Conventionally, as a method of forming conductive wiring on an insulated base material, there is a photolithographic method for etching copper foil formed on an insulated base material and then sintering the same, or a printing method for screen-printing or inkjet-printing conductive paste on an insulated base material and then sintering the same.

For the purpose of solving a problem of too many processes in the photolithographic method and a problem of surface oxidation tendency of metal particles used in the conductive paste in the printing method together, a method of manufacturing a circuit board using conductive paste containing metal microparticles, which are metallic materials having particle diameter of the order of microns, and metal nanoparticles, which are metallic materials having particle diameter of the order of nanometers, is disclosed (for example, refer to Patent Literature 1).

CITATION LIST

Patent Literature

Patent Literature 1: Japanese Unexamined Patent Application Publication No. 2007-53212 (page 6, FIG. 1)

SUMMARY OF INVENTION

Technical Problem

The invention disclosed in Patent Literature 1 supplies the conductive paste containing the metal microparticles and the metal nanoparticles to an insulated substrate by screen printing and sinters the same under a low-oxygen atmosphere, to thereby sinter the metal nanoparticles. For this reason, there was a problem of difficulty in selecting conductive paste that satisfies both securing fluidity suitable for screen printing and suppressing increase in electrical resistance value. In other words, to set a material and a particle diameter of the metal microparticles, a material and a particle diameter of the metal nanoparticles, a type of solvent, and an amount of each of these (each proportion in the conductive paste) appropriate to properties of conductive wiring formed on an insulated substrate, a large number of tests and a long period of time were required.

The present invention is to solve the above-described problem, and to provide a method of manufacturing conductive wiring capable of easily forming conductive wiring of desired properties on an insulated substrate without supplying conductive paste onto the insulated substrate by screen printing, and to provide conductive wiring formed by the method of manufacturing conductive wiring.

Solution to Problem (1) A method of manufacturing conductive wiring according to the present invention includes: a process of printing ink on an insulated substrate to form a predetermined pattern; a process of placing conductive powder on the printed ink before the ink is dried; a process of pressing the placed conductive powder against the insulated substrate to compress the conductive powder; and a process of heating the compressed conductive powder to sinter the conductive powder.

(2) Moreover, the heating is carried out by irradiating the compressed conductive powder with ultraviolet light or laser light.

(3) Moreover, the conductive powder is fine particles of 1 to 50 microns.

(4) Moreover, the insulated substrate is white or transparent, and the laser light is YAG laser light.

(5) Further, conductive wiring according to the present invention is formed by the method of manufacturing conductive wiring described in any of the above (1) to (4).

Advantageous Effects of Invention (i) In a method of supplying conductive paste onto an insulated substrate by screen printing or the like, conductive powder in an ink degrades printing accuracy and it is impossible to increase density of the conductive powder; in contrast, a method of manufacturing conductive wiring according to the present invention is able to select an ink suitable for printing predetermined patterns with ease, and therefore, printing accuracy can be increased. In addition, it is possible to increase density of the conductive wiring, to thereby improve conductivity, and to save the trouble of selecting the conductive paste that satisfies both screen-printing performance and electrical conductivity as conventional, and thereby, operations are quickly done.

(ii) Moreover, since sintering is performed by irradiation with laser light or ultraviolet light, the conductive wiring is able to be manufactured at a low cost. Note that, the material of the conductive powder is not limited, and the material is copper, copper alloy, or silver, silver alloy, or the like.

(iii) Moreover, since the conductive powder includes fine particles of 1-50 microns ($\mu$m), sintering is accelerated, the density of the conductive wiring is able to be increased further, to make it possible to further improve conductivity.

(iv) Moreover, the insulated substrate is made white or transparent and the white or transparent insulated substrate is irradiated with YAG laser light having a property to pass through a white or transparent base material, and thereby, heating of the insulated substrate can be suppressed. Accordingly, since it becomes unnecessary to limit the material of the insulated substrate to a heat-resistant material, such as a ceramic plate, more options for the insulated substrate are offered and it is possible to manufacture the conductive wiring at a low cost by use of an inexpensive insulated substrate.

(v) Moreover, conductive wiring according to the present invention is formed by the method of manufacturing conductive wiring having the effects described in any of the

DESCRIPTION OF EMBODIMENTS

Embodiment 1

Figure 1:
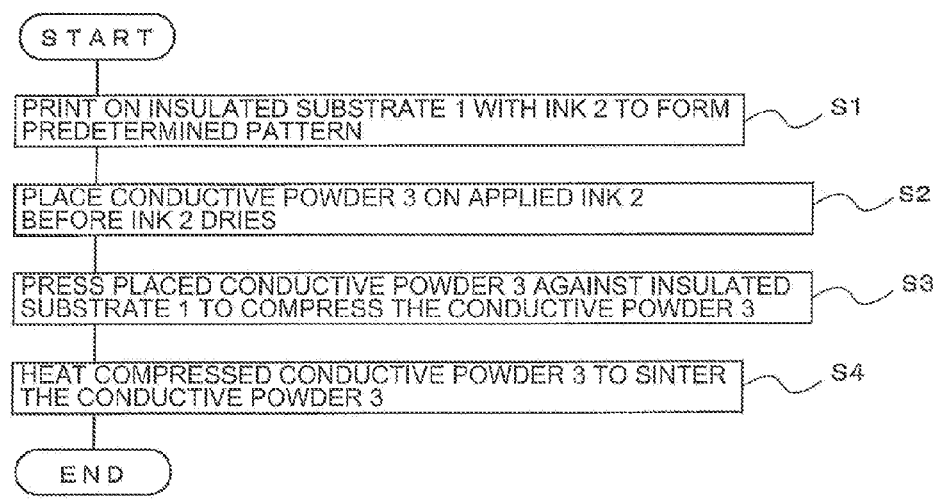
FIG. 1 is a flowchart illustrating a method of manufacturing conductive wiring according to Embodiment 1 of the present invention.

FIG. 1 and FIG. 2 illustrate a method of manufacturing conductive wiring and conductive wiring manufactured by such a method of manufacturing conductive wiring according to Embodiment 1 of the present invention, and FIG. 1 is a flowchart and FIGS. 2A to 2E are cross-sectional diagrams from lateral view schematically showing each of processes. Note that FIGS. 2A to 2E schematically show a part exaggeratedly, and the present invention is not limited to the shown embodiments (sizes and quantities).

In FIG. 1 and FIGS. 2A to 2E, the method of manufacturing conductive wiring includes: a process of printing on an insulated substrate 1 (FIG. 2A) with ink 2 to form a predetermined pattern (S1 in FIG. 1, FIG. 2B); placing (spraying) conductive powder 3 on the ink 2 (in the predetermined pattern) before the printed ink 2 dries (S2 in FIG. 1, FIG. 2C); pressing the placed conductive powder 3 against the insulated substrate 1 to compress the conductive powder 3 (S3 in FIG. 1, FIG. 2D); and heating the compressed conductive powder 3 to sinter the conductive powder 3 (S4 in FIG. 1, FIG. 2E), and by such a series of processes (S1 to S4), conductive wiring 20 is manufactured.

Note that, in the present invention, the compressing process (S3) and the heating and sintering process (S4) are not limited to those successively carried out, but may be carried out at the same time.

At this time, the conductive powder 3 is, for example, fine particles of copper or copper alloy, and has average particle diameter of, for example, 1-200 microns; however, the present invention does not limit the range of the average particle diameter of the conductive powder 3. However, if fine particles whose average particle diameter is in the range of 1-50 microns are adopted as the conductive powder 3, sintering is accelerated and the density of the conductive wiring 20 can be further increased, and thereby it is possible to further improve the conductivity.

Then, since the conductive powder 3 is sprayed onto the insulated substrate 1 before the printed ink 2 is dried, the conductive powder 3 is attached to the ink 2 before being dried (indicated by diagonal hatched lines), and accordingly, the conductive powder 3 attached to the ink 2 results in forming the predetermined pattern.

Moreover, the above-described heating is carried out by irradiating the compressed conductive powder 3 with laser light (for example, YAG laser light) 30.

Note that, since the conductive powder 3 attached to the ink 2 is compressed (the ink 2 and the conductive powder 3 are collectively indicated by cross-hatched lines) before irradiation with laser light, spacing between the particles in the conductive powder 3 (exactly, a size of a pore) is reduced and the density is increased, to thereby accelerate sintering, and accordingly, it is possible to carry out heating operation quicker at lower temperature (sintered conductive powder 4 is indicated by a solid fill). Note that, in heating, irradiation may be carried out with ultraviolet light (canon light) instead of the laser light 30.

In other words, since the method of manufacturing conductive wiring according to the present invention is not the one supplying the conductive paste to the insulated substrate 1 by the screen printing or the like, it is possible to easily select the ink 2 suitable for printing of the predetermined pattern and easily select the conductive powder 3 appropriate to the properties of the conductive wiring, and therefore, it is possible to improve printing accuracy, increase the density of the sintered conductive powder 4 and improve conductivity. Moreover, the trouble of selecting the conductive paste to satisfy both screen-printing performance and electrical conductivity as conventional is saved, and thereby, operations are quickly done.

Moreover, since, if fine particles whose average particle diameter is in the range of 1-50 microns are adopted as the conductive powder 3, sintering is accelerated by irradiation with the ultraviolet light or the laser light, it is possible to manufacture conductive wiring (sintered conductive powder 4) having high conductivity at a low cost.

At this time, if the insulated substrate 1 is made white or transparent and then irradiated with YAG laser light as the laser light, heating of the insulated substrate 1 can be suppressed because the YAG laser light has a property to pass through a white or transparent base material. Accordingly, since it becomes unnecessary to limit the material of the insulated substrate 1 to a heat-resistant material, such as a ceramic plate, more options for the insulated substrate are offered and it is possible to manufacture the conductive wiring 20 (refer to Embodiment 2) at a low cost by use of an inexpensive insulated substrate.

Figure 2A:
FIG. 2A is a cross-sectional diagram from lateral view schematically showing an insulated substrate in the method of manufacturing conductive wiring according to Embodiment 1 of the present invention.
Figure 2B:
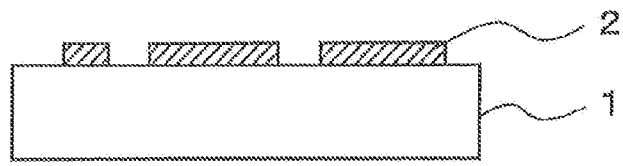
FIG. 2B is a cross-sectional diagram from lateral view schematically showing each process in the method of manufacturing conductive wiring according to Embodiment 1 of the present invention.
Figure 2C:
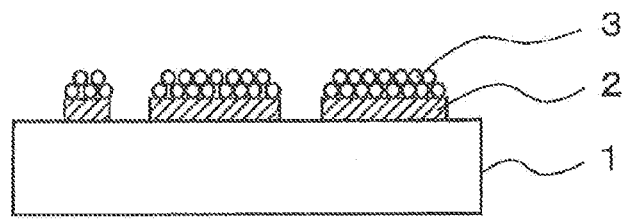
FIG. 2C is a cross-sectional diagram from lateral view schematically showing a process of placing (spraying) conductive powder in the method of manufacturing conductive wiring according to Embodiment 1 of the present invention.
Figure 2D:
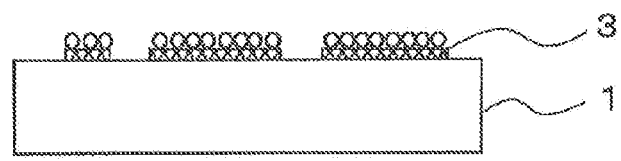
FIG. 2D is a cross-sectional diagram from lateral view schematically showing a process of pressing the conductive powder against the insulated substrate to compress the conductive powder in the method of manufacturing conductive wiring according to Embodiment 1 of the present invention.
Figure 2E:
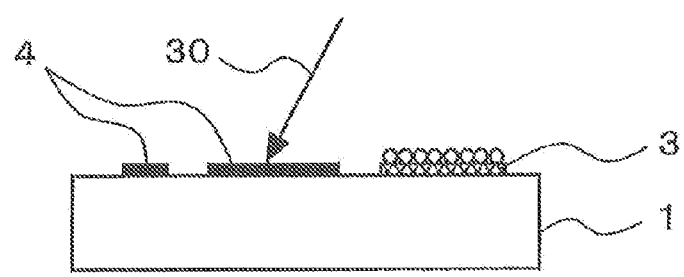
FIG. 2E is a cross-sectional diagram from lateral view schematically showing a process of heating the compressed conductive powder 3 to sinter the conductive powder 3 in the method of manufacturing conductive wiring according to Embodiment 1 of the present invention.

Note that, in FIG. 2D, the conductive powder 3 in the particle state is attached onto the part indicated by the cross-hatched lines (the ink 2 and the conductive powder 3) and respective thicknesses thereof are substantially the same; however, the present invention is not limited thereto and the thickness of one may be larger than the other, and in addition, the conductive powder 3 attached onto the part indicated by the cross-hatched lines is not limited to a single layer. Further, the conductive powder 3 attached onto the part indicated by the cross-hatched lines may be absent, and there may be only the part indicated by the cross-hatched lines.

Embodiment 2

Figure 3:
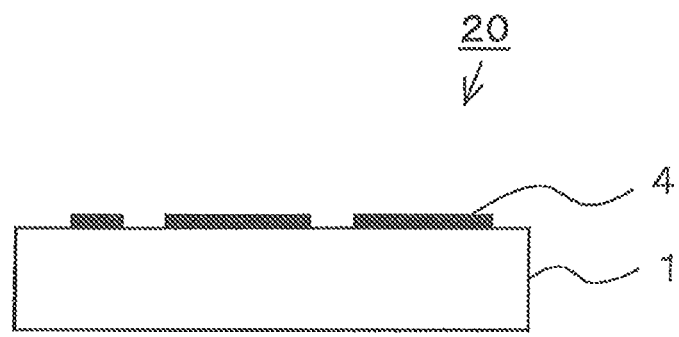
FIG. 3 is a cross-sectional diagram from lateral view schematically showing conductive wiring according to Embodiment 2 of the present invention.

FIG. 3 is a cross-sectional diagram from lateral view showing conductive wiring according to Embodiment 2 of the present invention. Note that components which are the same as those in FIG. 2 are assigned the same reference signs, and part of description is omitted.

In FIG. 3, the conductive wiring 20 shows a predetermined pattern drawn by the conductive powder 4 sintered on the insulated substrate 1. At this time, since being formed by the method of manufacturing the conductive wiring, the conductive wiring 20 has excellent conductivity and is low in price.

Note that the insulated substrate 1 is not limited to a flat surface, but may be a curved surface. Moreover, there is no limitation to the pattern drawn by the conductive powder 3, and there is also no limitation to the material (ingredients) of the conductive powder 3.

INDUSTRIAL APPLICABILITY

Since, according to the present invention, it is possible to easily manufacture conductive wiring of a desired pattern at a low cost, the present invention is able to be widely used as a method of manufacturing conductive wiring on insulated substrates of various shapes.

REFERENCE SIGNS LIST 1 insulated substrate 2 ink 3 conductive powder 4 sintered conductive powder 20 conductive wiring 30 laser light

The invention claimed is:
1. A method of manufacturing conductive wiring, the method comprising:
    printing on an insulated substrate with ink to form a predetermined pattern;
    placing conductive powder on the ink before the ink dries;
    pressing the placed conductive powder against the insulated substrate to compress the conductive powder; and
    heating the compressed conductive powder to sinter the conductive powder,
    wherein the insulated substrate is white or transparent, and the heating includes irradiating the compressed conductive powder with YAG laser light.
2. The method of claim 1, wherein the conductive powder is fine particles of 1 to 50 microns.
3. Conductive wiring being formed by the method of claim 1.

* * * * *